US008816765B2

(12) United States Patent
Rodal

(10) Patent No.: US 8,816,765 B2
(45) Date of Patent: Aug. 26, 2014

(54) COUPLED INDUCTOR AND CALIBRATED COMPLEMENTARY LOW NOISE AMPLIFIERS

(75) Inventor: Eric Bernard Rodal, Gardnerville, NV (US)

(73) Assignee: Broadcom Corporation, Irvine, CA (US)

( * ) Notice: Subject to any disclaimer, the term of this patent is extended or adjusted under 35 U.S.C. 154(b) by 28 days.

(21) Appl. No.: 13/585,365

(22) Filed: Aug. 14, 2012

(65) Prior Publication Data

US 2014/0049326 A1 Feb. 20, 2014

(51) Int. Cl.
*H03F 1/14* (2006.01)
(52) U.S. Cl.
USPC ............................................................ 330/51
(58) Field of Classification Search
USPC ............................................. 330/51, 262–264
See application file for complete search history.

(56) References Cited

U.S. PATENT DOCUMENTS

| | | | | |
|---|---|---|---|---|
| 5,220,216 A | * | 6/1993 | Woo | 327/278 |
| 5,430,393 A | * | 7/1995 | Shankar et al. | 327/142 |
| 6,525,569 B1 | * | 2/2003 | Leon | 326/83 |
| 7,564,302 B2 | * | 7/2009 | Zolfaghari | 330/51 |
| 7,920,027 B2 | * | 4/2011 | Keerti | 330/264 |
| 8,212,619 B2 | * | 7/2012 | Han et al. | 330/271 |
| 2009/0251210 A1 | * | 10/2009 | Zolfaghari | 330/51 |

* cited by examiner

*Primary Examiner* — Khanh V Nguyen
(74) *Attorney, Agent, or Firm* — Brinks Gilson & Lione

(57) ABSTRACT

A low noise amplifier (LNA) includes a bank of selectable first transistors and a bank of selectable second transistors complementary to the first transistors. The LNA also includes a plurality of switches to select one or more of the first transistors and to select one or more of the second transistors, the selected first transistors positioned in series with respect to the selected second transistors. The LNA also includes switching logic to control the plurality of switches, to simultaneously vary selection of the first transistors and the second transistors during calibration to substantially match output second-order distortion of the selected first transistors with that of the selected second transistors, to create high second-order intercept points.

20 Claims, 8 Drawing Sheets

US 8,816,765 B2

COUPLED INDUCTOR AND CALIBRATED COMPLEMENTARY LOW NOISE AMPLIFIERS

TECHNICAL FIELD

This disclosure relates to improving the noise figure and reducing power consumption of a low noise amplifier typically used in mobile devices.

BACKGROUND

Rapid advances in electronics and communication technologies, driven by immense customer demand, have resulted in the widespread adoption of mobile communication devices, including mobile phones, smart phone and/or global positioning devices (GPSs). Low noise amplifiers (LNAs) can be used to amplify weak signals captured by the antenna of such devices. An LNA is normally placed at the front-end of a radio or GPS receiver circuit.

BRIEF DESCRIPTION OF THE DRAWINGS

The innovation may be better understood with reference to the following drawings and description. In the figures, like reference numerals designate corresponding parts throughout the different views.

DETAILED DESCRIPTION

The discussion below makes reference to calibration and gain of low noise amplifiers (LNA) in a Global Navigation Satellite System (GNSS) device, such as for instance, in a Global Positioning System (GPS) device, a radio receiver and in other devices that include transmit power amplifiers such as within Bluetooth® wireless LAN and cellular devices. A GNSS device may similarly be configured for use with other countries' satellite systems, such as for connection to GLO-NASS satellites (Russian), Galileo satellites (Europe), or Beidou satellites (China).

A GPS or radio receiver can be subject to interference from a growing number of interference sources, including any number of broadcasted signals and electronics that surround us. Because low power can be important for mobile devices, producing a clean and strong signal within a mobile device can present a challenge. Second or even-order harmonics of some received signals may coincide or approximate—and thus interfere—with GNSS, GPS or other radio signals needed for proper operation.

This disclosure relates to a complementary LNA design that is capable of automated calibration through active device switching that enables second-order distortion matching, thus creating high second-order intercept points that substantially reduce second order harmonic interference. This disclosure also relates to adding a coupled inductor strategically with capacitor placement that creates high gain and a good noise figure in a complementary inductor design.

Figure 1:
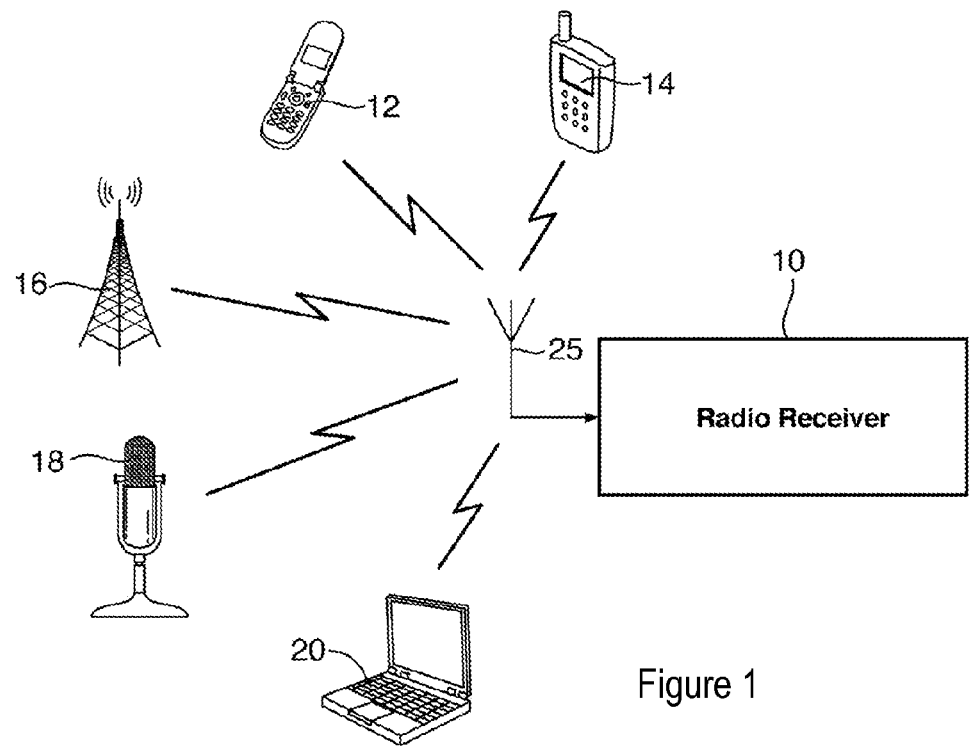
FIG. 1 shows examples of sources of interference to which a radio receiver can be subject.

FIG. 1 shows examples of sources of interference to which a radio receiver can be subject. For instance, a radio receiver 10 is surrounded by a growing variety of sources of interference, including signals from cell phones 12, smart phones 14, transmission towers 16, broadcasting stations 18 and computing devices 20, including all kinds of electronic devices such as microwave ovens, home automation equipment, and wireless networks. An antenna 25 of the radio receiver can pick up these many types of electronic signals, waves and interference, in addition to the signals it wants to receive and amplify for receipt by a radio user.

Figure 2:
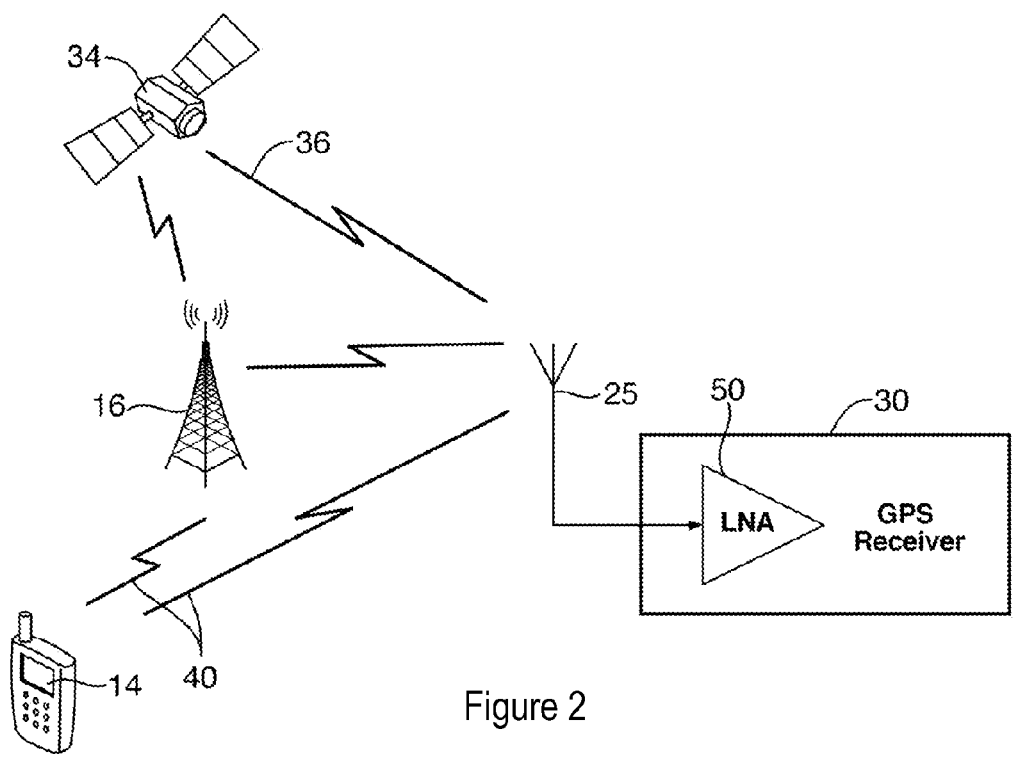
FIG. 2 is an example of second harmonics produced within a Global Navigation Satellite System (GNSS) receiver from LTE frequency band signals of an associated smart phone.

FIG. 2 is an example of second harmonics produced within a GNSS (or GPS) receiver 30 from LTE frequency band signals of an associated smart phone 14. Such second harmonics is just one example of the interferences referenced in FIG. 1. A satellite 34 transmits a GNSS signal 36 in an approximate range of 1574.42 MHz to 1576.42 MHz to the GNSS receiver 30. As is the case with many consumer GNSS receivers, a smart phone 14 may be associated with the GNSS receiver 30, as a single device. If not associated, a user may be using a smart phone 14 in the proximity of the antenna 25 of the GNSS receiver 30. Many smart phones now operate in an LTE frequency band 13 (for Verizon®) 40 in an approximate range of 777 MHz to 787 MHz. Second harmonics of LTE band 13 therefore appear between 1,554 MHz and 1,574 MHz, the upper of which is adjacent to the frequency range of the GNSS receiver 30 and thus can cause interference. Including an LNA 50 with high second-order intercept points (iIP2 and iHIP2) reduces the effect of this interference, where iIP2 stands for input second-order intercept point and iHIP2 stands for input second-harmonic intercept point. For purposes of explanation, the disclosure is described in terms of the LTE frequency band, but interference reduction in other bands can also be performed.

An LNA 50 includes an electronic amplifier used to amplify possibly weak signals, for example, captured by the antenna 25. An LNA can be located close to a detection device such as the antenna 25 to reduce losses in the feed line of the detection device. Such an active antenna arrangement can be used in microwave systems like GNSS/GPS because coaxial cable feed lines are lossy at microwave frequencies, e.g., a loss of ten percent coming from a few meters of cable would cause a ten percent degradation of the signal-to-noise ratio (SNR).

An LNA can help to improve the SNR by being placed at the front end of a radio receiver circuit (or the like) as shown in FIG. 2. According to Friss's formula, the overall noise figure (NF) of the receiver's front end may be dominated by the first few stages, or even just the first stage. Using an LNA, the effect of noise from subsequent stages of a receive chain can be reduced by the gain of the LNA, while the noise of the LNA itself is injected directly into the received signal. Thus, an LNA can be used to boost the desired signal power while adding as little noise and distortion as possible, so that the retrieval of this signal is possible in the later stages in the system. An LNA can have a low NF (like about 1 dB or less) and a large enough gain (e.g., at least 20 dB) among other features.

Figure 3:
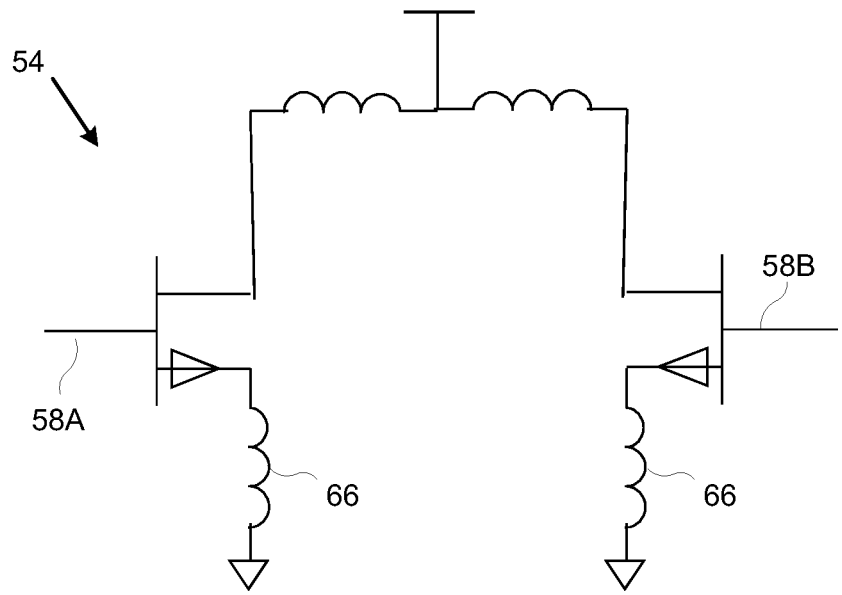
FIG. 3 is an example of a differential low noise amplifier (LNA) design.
Figure 4:
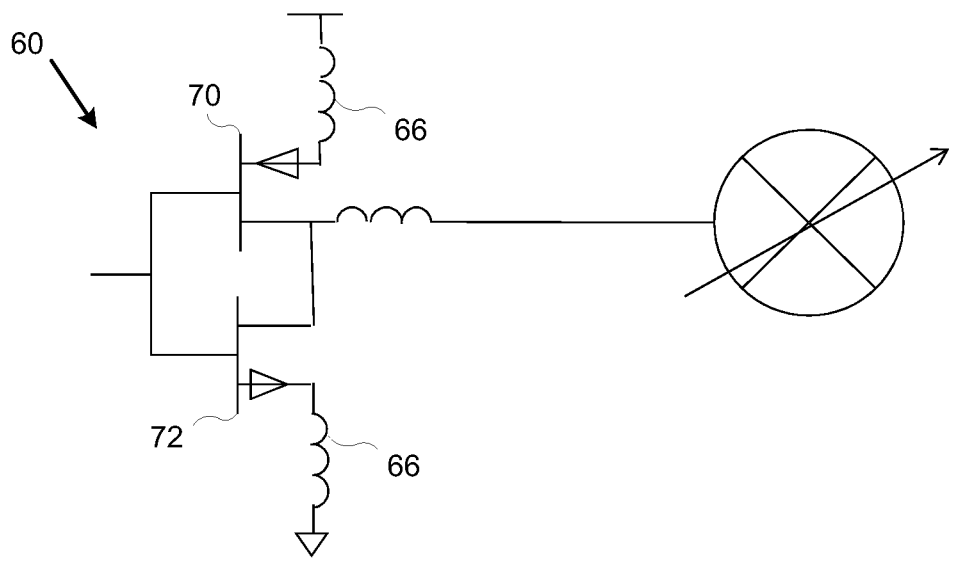
FIG. 4 is an example of use of a calibrated mixer to attempt to improve second-order intercept points of a complementary LNA design.

FIG. 3 is an example of a differential low noise amplifier (LNA) design 54. FIG. 4 is an example of use of a calibrated mixer 56 to improve second-order intercept points of a complementary LNA design 60. Differential and complementary LNA designs are examples of ways to achieve high second-order intercept points. The differential LNA design 60 includes input pins 58A and 58B and can be higher in power consumption as a result. The complementary LNA design 60 can have low gain and high noise figure due to low $V_{ds}$ for the active devices. Inductive source degeneration, executed by placement of inductors 66 at the source of the active devices, is also a way of increasing linearity while also useful in obtaining a good input match.

A complementary LNA design 60 can provide very high second order intercept points due to its symmetrical design. While the typical unit can achieve such high second-order intercept points, performance may be limited due to process variations of the p-mos 70 and n-mos 72 devices not always being ideally matched. The calibrated mixers 56 have been used to improve iIP2.

Figure 5:
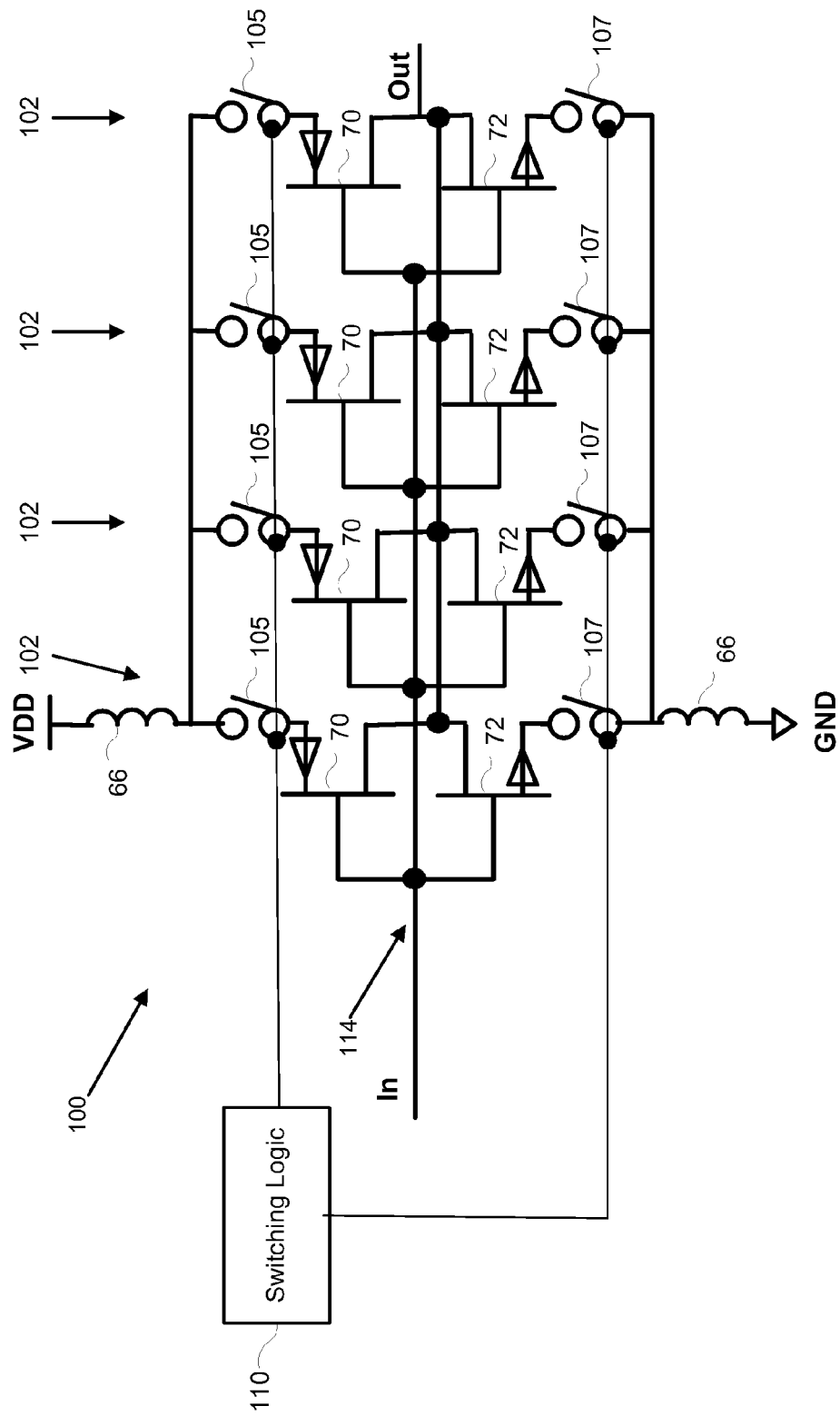
FIG. 5 is an example of a complementary LNA capable of calibration to improve second-order intercept points and high second-order intercept points.

FIG. 5 is an example of a complementary LNA 100 capable of calibration to improve second-order intercept points (iIP2) and of high second-order intercept points (iHIP2). The complementary LNA 100 may include multiple banks 102 of selectable transistors 70 and selectable complementary transistors 72, respectively, to enable calibration. By way of example, the selectable transistors 70 may be p-mos transistors 70 and the selectable complementary transistors 72 may be n-mos transistors 72. For simplicity of explanation, the remainder of the discussion will assume the transistors 70 connected to VDD (or power) are p-mos transistors and the transistors 72 connected to ground are n-mos transistors, although different types of complementary active devices may be used together as well. Any complementary-symmetry pairs of integrated circuit devices may be employed. For instance, pnp and npn bipolar transistors (as created in a bipolar or bi-cmos integrated circuit process) could also be used, in which case an emitter, a base and a collector would correspond to the source, gate and drain of a complementary metal-oxide semiconductor (CMOS) device.

At least some of the p-mos transistors, which are selectable in parallel, may be of different sizes and at least some of the n-mos transistors, which are selectable in parallel, may be of different sizes. The banks of p-mos and n-mos transistors may be configured so that selected p-mos transistors are arranged in series with the n-mos transistors in a complementary LNA design. A plurality of switches 105 make the p-mos transistors 70 selectable and a plurality of additional switches 107 make the n-mos transistors 72 selectable. Integrating switches in the source is only one way to create a variable transistor size. Alternatively, a gate voltage on a cascode device may be switched. Another method includes keeping the transistor sizes the same and varying current or voltage biases of the transistors.

The complementary LNA 100 may also include switching logic 110 that performs the calibration in response to a calibration signal 114 at the input of the LNA 100. The switching logic 110 may include digital registers or a programmed logic device (or the like, such as a processor) that can simultaneously select one or more p-mos transistors 70 and one or more n-mos transistors 72, to thus vary a ratio of size between the selected p-mos transistors and the selected n-mos transistors. The ability to vary this ratio enables automated calibration for process variances between the p-mos and the n-mos transistors so as to match or to substantially match impedance of the selected p-mos transistors when compared with all the selected n-mos transistors.

Keeping the total transistor size constant may further enable matching the magnitude of second-order distortion products at the output of the LNA. The p-mos and n-mos transistors may generate second-order distortion products that are 180 degrees out of phase. Changing the relative size of the p-mos and n-mos transistors changes the relative amplitude of the second-order distortion products generated by each device. By properly choosing the transistor device sizes, the second-order distortion products of the p-mos and the n-mos transistors can be made to cancel out or to substantially cancel out.

Furthermore, the current flowing through the selected p-mos transistors on the one hand and through the selected n-mos transistors on the other may also be adjusted based on a number of selected transistors. Twice as many transistors in parallel of the same size can carry twice the current. This calibration of the relative size of the selected p-mos transistors in relation to the selected n-mos transistors, and of the current running through them, can be such that virtually all even-order harmonics are cancelled out by creating a symmetrical circuit.

By changing the relative current flowing through the p-mos and n-mos transistors and/or by changing relative device size of the selected n-mos and p-mos transistors, the switching logic can effectively calibrate the iHIP2 and iIP2 numbers by controlling the switching of the switches 105 and 107. The calibration signal 114 can occur during automatic test equipment (ATE) test or automatically when the chip on which the LNA 100 resides is powered up. For instance, the calibration signal can be a single tone to calibrate the iHIP2 or two tones to calibrate iIP2.

Once the complementary LNA 100 is calibrated, the selection of the n-mos and of the p-mos transistors may be saved to flash memory or other storage for use thereafter, for instance, each time a chip or device on which the LNA 100 resides is powered up. Calibration can also be performed automatically each time the chip is powered up.

Figure 6:
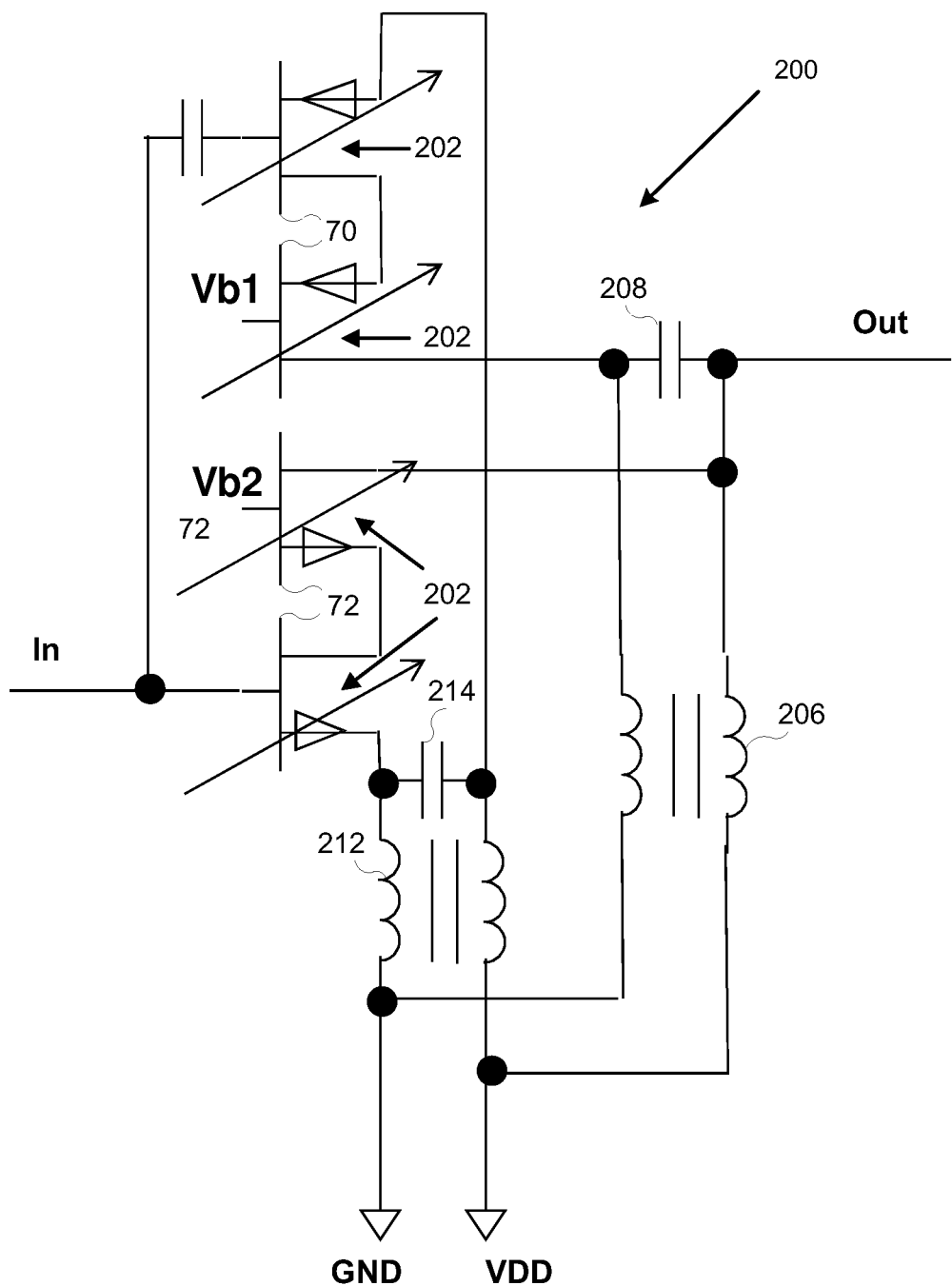
FIG. 6 is an example of a complementary LNA similar to that shown in FIG. 5 that also includes an optional coupled inductor for improving gain and noise figures.

FIG. 6 is an example of a complementary LNA 200 similar to that shown in FIG. 5 that also includes an optional coupled inductor 206 for improving gain and noise figures. Somewhat different from FIG. 5, however, the LNA 200 of FIG. 6 includes multiple banks 202 of selectable p-mos transistors 70 and multiple banks 204 of selectable n-mos transistors 72, each bank positioned in series relative to other banks.

Having multiple banks 202 and 204 of these active devices can provide for even more possible combinations in terms of numbers of selected n-mos and p-mos transistors (to vary current) and to more granularly adjust a ratio between the selected p-mos transistors and the selected n-mos transistors (to improve input impedance matching). Using just one bank 202 of p-mos transistors 70 and/or just one bank 204 of n-mos transistors 72 is, of course, an acceptable design as well.

The arrows through the respective banks 202 and 204 of transistors indicate that the banks 202 and 204 of p-mos and n-mos transistors 70 and 72 are variable in size, and thus in impedance. In this case, the transistors 70 and 72 are variable through selection by the switching logic 110 of a plurality of switches connected to respective p-mos and n-mos transistors 70 and 72 of respective banks 202 and 204, such as described with reference to FIG. 5.

Once connected, the selected p-mos transistors 70 are positioned in series with the selected n-mos transistors 72. A first capacitor 208 may be located between inductors of the coupled inductor 206, and between the drains of adjacent selected p-mos and n-mos transistors in the middle of the LNA 200. At least one inductor of the coupled inductor 208 is connected between the drain of the p-mos transistor 70 and ground and at least a second inductor of the coupled inductor 206 is connected between the drain of the n-mos transistor 72 and power (VDD).

A second coupled inductor 212 may be provided for source degeneration, which is also a way of increasing linearity while also useful in obtaining a good input impedance match and match of second-order harmonic outputs. The second coupled inductor 212, if used, may be positioned such that at least one inductor of the coupled inductor 212 is coupled with circuit power (VDD) and a source of the selected p-mos transistors 70; and at least another inductor of the coupled inductor 212 is coupled with ground (GND) and with a source of the selected n-mos transistors 72. Herein, the phrase "coupled with" can mean directly connected to or indirectly connected through one or more intermediate components. A second capacitor 214 may be located between inductors of the coupled inductor 212, and between the sources of the outside selected p-mos and n-mos transistors of the LNA 200. Also optional is use of a cascode design in addition to the complementary LNA design to provide still higher gain and lower noise figures.

In one example, there may be one or more selected p-mos transistors 70 and one or more selected n-mos transistors 72 in the design as shown in FIG. 6. Accordingly, use of two p-mos transistors in series at the top of the LNA and/or use of two n-mos transistors in series at the bottom of the LNA in not necessary to achieve the benefits of the coupled inductor 206 and/or the coupled inductor 214 and/or the capacitors 208 and 214. The complementary LNA design of FIG. 6 provides high second order intercept points, without sacrificing other performance metrics.

Figure 7:
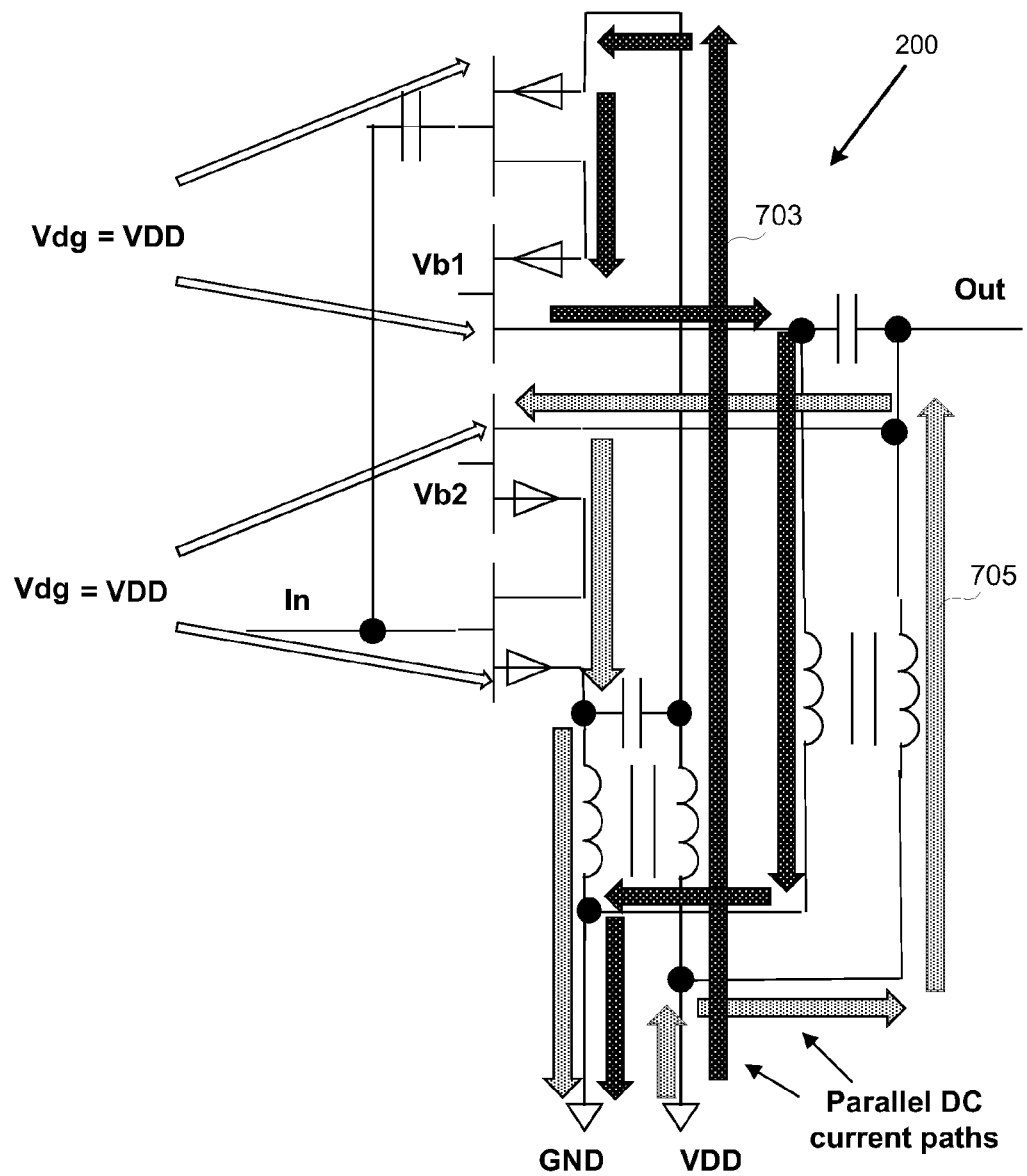
FIG. 7 is the complementary LNA with the coupled inductor of FIG. 6, including parallel DC current paths.

FIG. 7 includes the calibrated complementary LNA 200 with the coupled inductor of FIG. 6, showing parallel DC current paths 703 and 705 created by placement of the capacitors 208 and 214 and coupled inductors 206 and 212 with reference to the transistors of the complementary LNA design as explained with reference to FIG. 6. DC current passes through the coupled inductors but not through the capacitors to form the parallel DC current paths 703 and 705. Having n-mos and p-mos devices in DC parallel rather than in DC series provides for high drain-source voltages ($V_{ds}$) and thus high gain and a good noise figure. The coupled inductors 206 and 212 may be stacked across device layers so there need be no increase in die area over standard inductors.

The second, or source degeneration, coupled inductor 212 is not necessary, but has been shown to help cancel out second-order distortion by ensuring that the phase delay through the p-mos and n-mos devices is the same. The result is a stronger, cleaner AC signal passed to the output. If the second coupled inductor 212 is not used, the source of the top p-mos transistor 202 may be connected to Vdd and the source of the bottom n-mos transistor 202 may be connected to ground.

Figure 8:
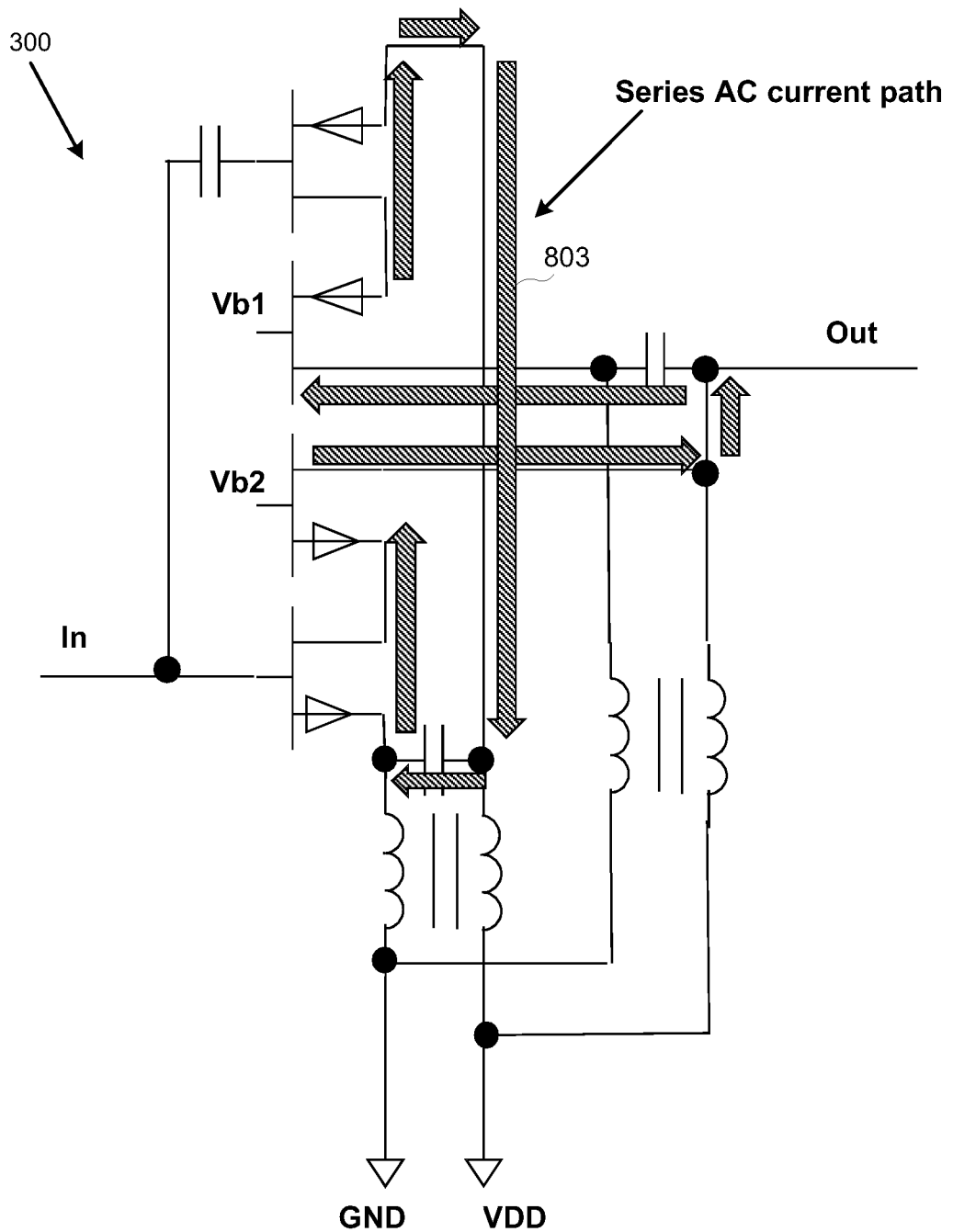
FIG. 8 is the complementary LNA with the coupled inductor of FIG. 6, including a series AC current path.

FIG. 8 includes the calibrated complementary LNA 200 with the coupled inductor 206 of FIG. 6, showing a series AC current path 803 created by placement of the capacitors and inductors with reference to the calibrated complementary LNA design as discussed with reference to FIG. 6. The AC current does not pass through the inductors, but does pass through the capacitors, creating the series AC current path 803 that keeps the signal desired for transmission within the active devices 70 and 72. Accordingly, the signal embodied in the AC current can benefit from the good gain and noise figure from the parallel DC current paths 703 and 705 shown in FIG. 7.

Figure 9:
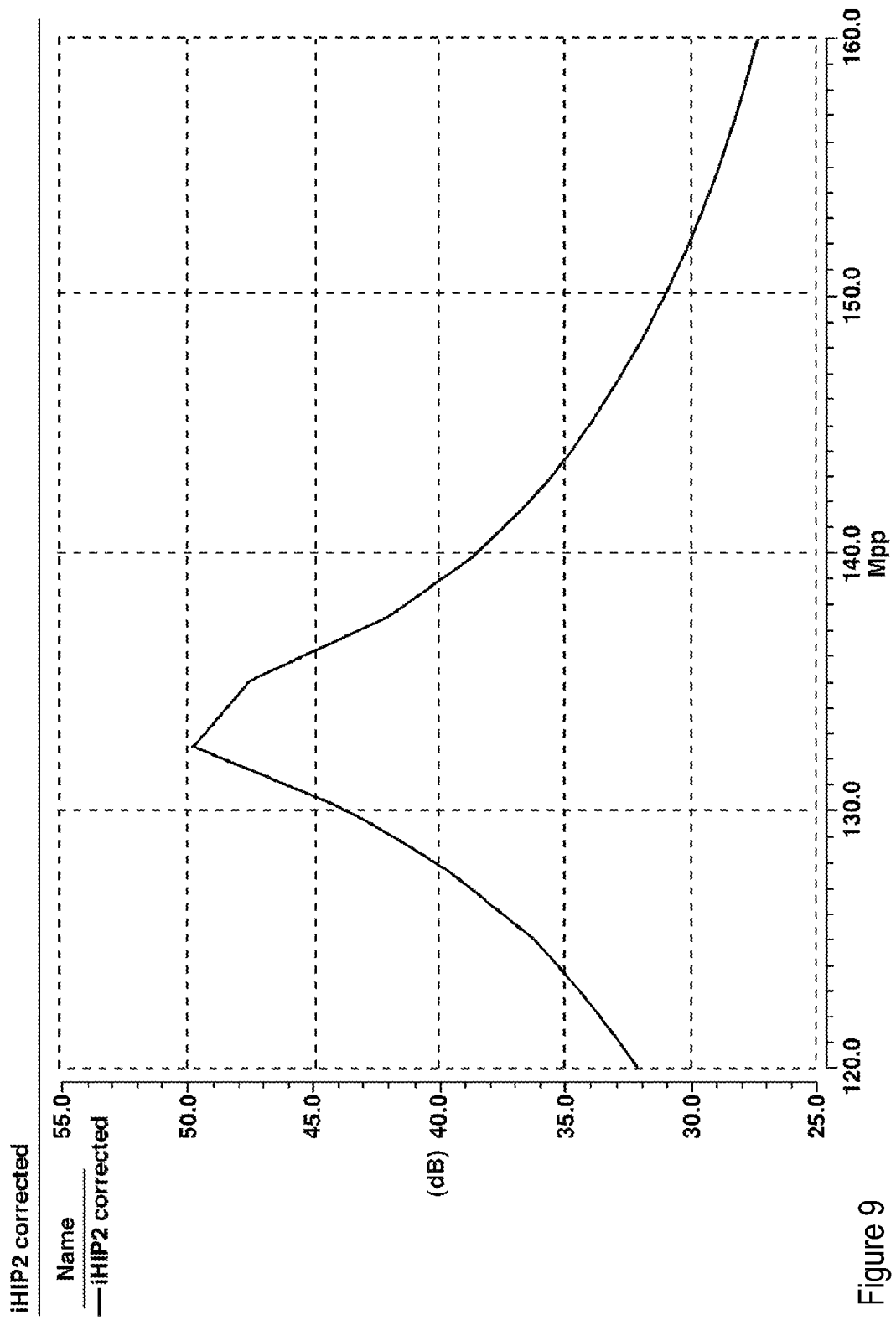
FIG. 9 is a graph of an example simulation result in a mobile device in which is used the calibrated complementary LNA of FIG. 5 or 6.

FIG. 9 is a graph of an example simulation result in a mobile device in which is used the calibrated complementary LNA of FIG. 5 or 6. Without calibration, the LNA for which this simulation was conducted would have a high second-order intercept point (iHIP2) of about 20 dBm as a worst case due to process variation of the active devices, the p-mos and n-mos transistors. By calibrating the LNA with the designs shown and discussed with reference to FIGS. 6 through 8, a much higher iHIP2 of up to 50 dBm and higher can be generated. The higher second-order intercept points reduce or substantially eliminate second-order (or other even-order) harmonics that create interference. iIP2 is a measure of the second order distortion. Increasing the iIP2 from 20 to 50 is a factor of 1000.

One example of a complementary low noise amplifier includes a bank of selectable p-mos transistors, at least some of which are different sizes, and a bank of selectable n-mos transistors, at least some of which are different sizes. The LNA also includes a plurality of switches to select one or more of the p-mos transistors and to select one or more of the n-mos transistors, the selected p-mos transistors positioned in series with respect to the selected n-mos transistors. Switching logic may be configured to control the plurality of switches, to simultaneously vary the selected p-mos transistors and the selected n-mos transistors during calibration such as to substantially match output second-order distortion of the selected p-mos transistors with that of the selected n-mos transistors, to create high second-order intercept points. Coupled inductor(s) and capacitors may be positioned to create dual, parallel DC current paths and to create a single, series AC current path.

Figure 10:
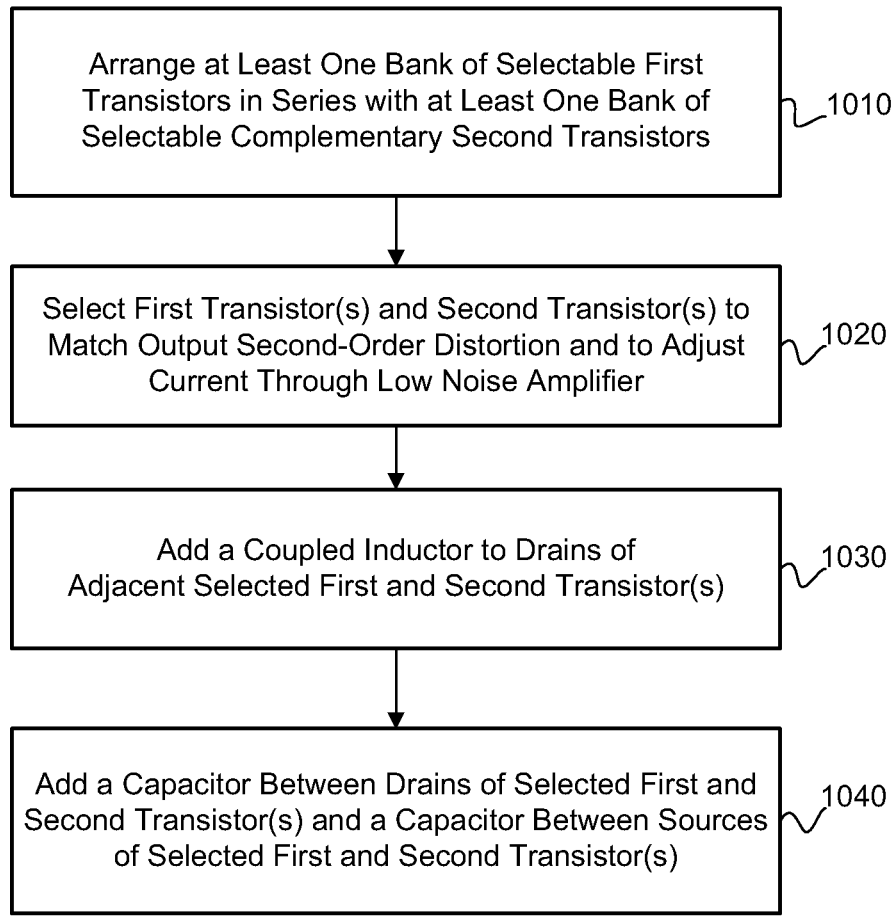
FIG. 10 is a flow chart of a method for assembling and calibrating a complementary LNA to increase second-order intercept points such as to increase gain and produce a good noise figure.

FIG. 10 is a flow chart of a method for assembling and calibrating a complementary LNA to increase second-order intercept points such as to increase gain and produce a good noise figure. The steps of the method need not occur in the listed order. At block 1010, the method includes to arrange at least one bank of selectable first transistors in series with at least one bank of selectable second transistors that are complementary to the selectable first transistors. At block 1020, switching logic selects one or more first transistors and one or more second transistors to substantially match output second-order distortion and to adjust current through the LNA. At block 1030, the method includes to add a coupled inductor to drains of adjacent first and second devices that are connected in series. Other ends of the inductors on the coupled inductor may be coupled with ground and power, respectively. A second coupled inductor may be added that has inductors that connect to sources of the selected first and second transistors at one end and to ground and power, respectively, at the other end. At block 1040, the method includes adding a capacitor between drains of selected first and second transistors and a capacitor between sources of selected first and second transistors.

The methods, devices, and logic described above may be implemented in many different ways in many different combinations of hardware, software or both hardware and software.

While various embodiments of the invention have been described, many more embodiments and implementations are possible within the scope of the invention. Accordingly, the invention is not to be restricted.

What is claimed is:

1. A low noise amplifier, comprising:
a bank of selectable first transistors;
a bank of selectable second transistors complementary to the first transistors;
a plurality of switches to select one or more of the first transistors and to select one or more of the second transistors, the selected first transistors positioned in series with respect to the selected second transistors; and
switching logic to control the plurality of switches in response to a calibration signal, the switching logic to simultaneously vary selection of the selectable first transistors and second transistors during calibration to substantially match second-order distortion products of the selected first transistors with that of the selected second transistors, to create high second-order intercept points.

2. The low noise amplifier of claim 1, where at least some of the selectable first transistors are of different sizes and at least some of the selectable second transistors are of different sizes, and where the switching logic varies a ratio of a size of the selected first transistors as compared to a size of the selected second transistors; and varies an amount of current depending on a number of the selected first transistors and second transistors.

3. The low noise amplifier of claim 1, further comprising:
a programmable logic device programmed with the selection of the first transistors and of the second transistors to retain said selections after calibration.

4. The low noise amplifier of claim 1, where calibration of a high second-order intercept point is performed with a single tone passed through the amplifier; and where calibration of a second-order intercept point is performed with two tones passed through the amplifier.

5. The low noise amplifier of claim 1, where the bank of selectable first transistors comprises at least two separate banks of selectable first transistors positioned in series such that the first transistors selected from the first bank are in series with the first transistors selected from the second bank.

6. The low noise amplifier of claim 1, where the bank of selectable second transistors comprises at least two separate banks of selectable second transistors positioned in series such that the second transistors selected from the first bank are in series with the selected transistors selected from the second bank.

7. A low noise amplifier, comprising:
at least one first transistor connected in series with at least one complementary second transistor, where a drain of the at least one first transistor connects through a first capacitor to a drain of the at least one second transistor, a source of the at least one first transistor connects through a second capacitor to a source of the at least one second transistor, and where the source of the at least one first transistor is coupled with power and the source of the at least one second transistor is coupled with ground; and
a coupled inductor including at least first and second inductors, the first inductor connected between the drain of the at least one first transistor and ground, and the second inductor connected between the drain of the at least one second transistor and power.

8. The low noise amplifier of claim 7, further comprising:
a second coupled inductor including at least third and fourth inductors, the third inductor connected between the source of the at least one second transistor and ground, and the fourth inductor connected between the source of the at least one first transistor and power.

9. The low noise amplifier of claim 7, where the at least one first transistor comprises a bank of selectable first transistors, at least some of which are of different sizes; and where the at least one second transistor comprises a bank of selectable second transistors, at least some of which are of different sizes, further comprising:
a plurality of switches to select one or more of the first transistors and to select one or more of the second transistors.

10. The low noise amplifier of claim 9, further comprising:
switching logic to control the plurality of switches, to simultaneously vary selection of the selectable first transistors and second transistors during calibration such as to substantially match second-order distortion products of the selected first transistors with that of the selected second transistors, to create high second order intercept points.

11. The low noise amplifier of claim 9, further comprising:
a second bank of selectable first transistors, at least some of which are of different sizes, positioned in series with the bank of selectable first transistors;
a second bank of selectable second transistors, at least some of which are of different sizes, positioned in series with the bank of selectable second transistors; and
a second plurality of switches to select one or more of the first transistors from the second bank of selectable first transistors and to select one or more of the second transistors from the second bank of selectable second transistors.

12. The low noise amplifier of claim 11, further comprising:
switching logic to control the plurality of switches, to simultaneously vary selection of the selectable first transistors and second transistors during calibration such as to substantially match second-order distortion products of the selected first transistors with that of the selected second transistors, to create high second order intercept points.

13. The low noise amplifier of claim 10, further comprising:
a programmable logic device programmed with the selection of the first transistors and of the second transistors to retain said selections after calibration.

14. The low noise amplifier of claim 7, where calibration of a high second-order intercept point is performed with a single tone passed through the amplifier, and where calibration of a second-order intercept point is performed with two tones passed through the amplifier.

15. A low noise amplifier, comprising:
a bank of selectable first transistors, at least some of which are of different sizes;
a bank of selectable second transistors complementary to the first transistors, at least some of which are of different sizes;
a plurality of switches;
where the selectable first transistors are connected in series with the selectable second transistors through the plurality of switches, where a drain of the selectable first transistors connect through a first capacitor to a drain of the selectable second transistors, a source of the selectable first transistors connect through a second capacitor to a source of the selectable second transistors, and where the source of the selectable first transistors are coupled with power and the source of the selectable second transistors are coupled with ground; and a coupled inductor including at least first and second inductors, the first inductor connected between the drain of the selectable first transistors and ground, and the second inductor connected between the drain of the selectable second transistors and power.

16. The low noise amplifier of claim 15, further comprising:

digital registers to control the plurality of switches, to simultaneously vary selection of the selectable first transistors and second transistors during calibration such as to substantially match second-order distortion products of the selected first transistors with that of the selected second transistors, to create high second-order intercept points.

17. The low noise amplifier of claim 15, further comprising:

a second coupled inductor including at least third and fourth inductors, the third inductor connected between the source of the at least one second transistor and ground, and the fourth inductor connected between the source of the at least one first transistor and power.

18. The low noise amplifier of claim 15, further comprising:

a second bank of selectable first transistors, at least some of which are of different sizes, positioned in series with the bank of selectable first transistors;

a second bank of selectable second transistors, at least some of which are of different sizes, positioned in series with the bank of selectable second transistors; and a second plurality of switches to select one or more of the first transistors from the second bank of selectable first transistors and to select one or more of the second transistors from the second bank of selectable second transistors.

19. The low noise amplifier of claim 18, further comprising:

digital registers to control the plurality of switches, to simultaneously vary selection of the selectable first transistors and second transistors during calibration such as to substantially match second-order distortion products of the selected first transistors with that of the selected second transistors, to create high second order intercept points.

20. The low noise amplifier of claim 19, further comprising:

a programmable logic device programmed with the selection of the first transistors and of the second transistors to retain said selections after calibration.

* * * * *